(12) United States Patent
Poon et al.

(10) Patent No.: US 7,576,833 B2
(45) Date of Patent: Aug. 18, 2009

(54) GAS CURTAIN TYPE IMMERSION LITHOGRAPHY TOOL USING POROUS MATERIAL FOR FLUID REMOVAL

(75) Inventors: Alex Ka Tim Poon, San Ramon, CA (US); Leonard Wai Fung Kho, San Francisco, CA (US); Gaurav Keswani, Fremont, CA (US); Derek Coon, Redwood City, CA (US)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 11/987,788

(22) Filed: Dec. 4, 2007

(65) Prior Publication Data

US 2009/0002648 A1 Jan. 1, 2009

Related U.S. Application Data

(60) Provisional application No. 60/929,468, filed on Jun. 28, 2007.

(51) Int. Cl.
G03B 27/42 (2006.01)
G03B 27/52 (2006.01)

(52) U.S. Cl. .......................................... 355/53; 355/30

(58) Field of Classification Search .................. 355/30, 355/53, 67, 71, 52, 55, 72; 378/34, 35; 250/548
See application file for complete search history.

(56) References Cited

U.S. PATENT DOCUMENTS

| 4,509,852 | A | 4/1985 | Tabarelli et al. |
| 7,388,648 | B2 * | 6/2008 | Lof et al. ...................... 355/53 |
| 2004/0207824 | A1 | 10/2004 | Lof et al. |
| 2004/0263809 | A1 | 12/2004 | Nakano |
| 2005/0007569 | A1 | 1/2005 | Streefkerk et al. |
| 2006/0038968 | A1 | 2/2006 | Kemper et al. |
| 2006/0087630 | A1 | 4/2006 | Kemper et al. |
| 2006/0152697 | A1 | 7/2006 | Poon et al. |
| 2006/0158627 | A1 | 7/2006 | Kemper et al. |
| 2007/0110213 | A1 * | 5/2007 | Leenders et al. .............. 378/34 |
| 2007/0222967 | A1 | 9/2007 | Poon et al. |

FOREIGN PATENT DOCUMENTS

| EP | 1 420 298 A1 | 5/2004 |
| EP | 1 477 856 A1 | 11/2004 |
| WO | WO 2004/090634 A2 | 10/2004 |
| WO | WO 2004/092833 A2 | 10/2004 |

OTHER PUBLICATIONS

Refractron Technologies Corp. Product Literature: Porous Ceramics and Specifications.

* cited by examiner

*Primary Examiner*—Hung Henry Nguyen
(74) *Attorney, Agent, or Firm*—Oliff & Berridge, PLC

(57) ABSTRACT

A gas curtain type immersion lithography apparatus has a fluid removing porous region adjacent the gas inlet to prevent evaporative cooling. The apparatus includes a substrate holder which holds a substrate having an imaging surface and a projection optical system having a last optical element. The projection optical system projects an image onto a target imaging area on the substrate through an immersion fluid filled in a gap between the imaging surface of the substrate and the last optical element. An immersion element maintains the immersion fluid in the gap. Gas is provided through an inlet into the gap. A porous region is provided adjacent the gas inlet. Immersion fluid that collects near the gas inlet is removed by the porous region.

37 Claims, 6 Drawing Sheets

GAS CURTAIN TYPE IMMERSION LITHOGRAPHY TOOL USING POROUS MATERIAL FOR FLUID REMOVAL

RELATED APPLICATIONS

This application claims the benefit of Provisional Application Ser. No. 60/929,468 filed on Jun. 28, 2007 and entitled "Use of Porous Absorbing Material in an Air Curtain Nozzle", the content of which is incorporated herein by reference in its entirety for all purposes.

BACKGROUND

1. Field of the Invention

The present invention relates to immersion lithography tools for forming an image on a substrate, and more particularly, to the use of porous material for fluid removal in a gas curtain type immersion element.

2. Related Art

A typical lithography tool includes a radiation source, a projection optical system, and a substrate stage to support and move a substrate to be imaged. A radiation-sensitive material, such as resist, is coated onto the substrate surface prior to placement onto the substrate stage. During operation, radiation energy from the radiation source is used to project an image defined by an imaging element through the projection optical system onto the substrate. The projection optical system typically includes a number of lenses. The lens or optical element closest to the substrate is often referred to as the "last" or "final" optical element.

The projection area during an exposure is typically much smaller than the imaging surface of the substrate. The substrate therefore has to be moved relative to the projection optical system to pattern the entire surface. In the semiconductor industry, two types of lithography tools are commonly used. With so-called "step and repeat" tools, the entire image pattern is projected at once in a single exposure onto a target area of the substrate. After the exposure, the wafer is moved or "stepped" in the X and/or Y direction and a new target area is exposed. This step and repeat process is performed over and over until the entire substrate surface is exposed. With scanning type lithography tools, the target area is exposed in a continuous or "scanning" motion. The imaging element is moved in one direction, while the substrate is moved in either the same or the opposite direction during exposure. After each scan, the substrate is then moved in the X and/or Y direction to the next scan target area. This process is repeated until all the desired areas on the substrate have all been exposed.

It should be noted that lithography tools are typically used to image or pattern semiconductor wafers and flat panel displays. The term "substrate", as used herein, is intended to generically mean any work piece that can be patterned, including, but not limited to, semiconductor wafers and flat panel displays.

Immersion lithography systems use a layer of fluid that fills a gap between the final optical element of the projection optical system and the substrate.

One known way to maintain the immersion fluid in the gap between the last optical element and the imaging surface of the substrate is by submerging both in a container filled with immersion fluid. See, for example U.S. Pat. No. 4,509,852, incorporated by reference herein in its entirety.

In another approach, which is a variation of the above-described submersion type tool, a confinement plate is used for submerging the substrate to be imaged in the immersion fluid. For more details on confinement plate type immersion lithography tools, see U.S. patent application Ser. No. 11/523,595, incorporated by reference herein in its entirety.

Another known way of maintaining the immersion fluid within the gap of a lithography tool is with the use of a nozzle that surrounds the last optical element immediately above the area to be exposed on the substrate. For more information on nozzle type immersion lithography tools, see U.S. Patent Publications 2006/0152697, 2007/0222967 and 2006/0087630, each incorporated herein by reference in its entirety.

Yet another known way of maintaining the immersion fluid in the gap where exposure of the substrate is to occur is with the use of a gas curtain. With a gas curtain design, an immersion element, typically with gas inlets and outlets, surrounds the last optical element of the projection optical system. The gas inlets are used to create a curtain of gas surrounding the exposure area, maintaining the fluid localized within the gap under the last optical element. The gas outlets are provided to remove the gas and any immersion fluid that may escape from the gap. For more information on gas curtain type immersion tools, see for example U.S. Patent publications 2005/0007569, 2006/0087630, 2006/0158627, and 2006/0038968, and/or European Patent Applications EP 1 477 856 A1 and EP 420 299 A2, each incorporated by reference herein in its entirety for all purposes.

The problem with the aforementioned gas curtain design is that immersion fluid may evaporate, causing cooling of the substrate. This is a significant problem because cooling may cause the substrate to contract, resulting in alignment, overlay and/or printing errors.

In a gas curtain type immersion lithography tool, prevention of evaporative cooling is therefore needed.

SUMMARY

An aspect of a gas curtain type immersion lithography apparatus includes a substrate holder which holds a substrate having an imaging surface and a projection optical system having a last optical element. The projection optical system projects an image onto a target imaging area on the substrate through an immersion fluid filled in a space between the imaging surface of the substrate and the last optical element. An immersion element maintains the immersion fluid in the space. Gas is provided through a gas inlet into the gap. A porous region is provided adjacent the gas inlet. Immersion fluid that collects near the gas inlet is removed by the porous region. As a result, evaporative cooling is significantly reduced or eliminated.

BRIEF DESCRIPTION OF THE DRAWINGS

Like reference numerals in the Figures refer to like elements.

DETAILED DESCRIPTION

Figure 1:
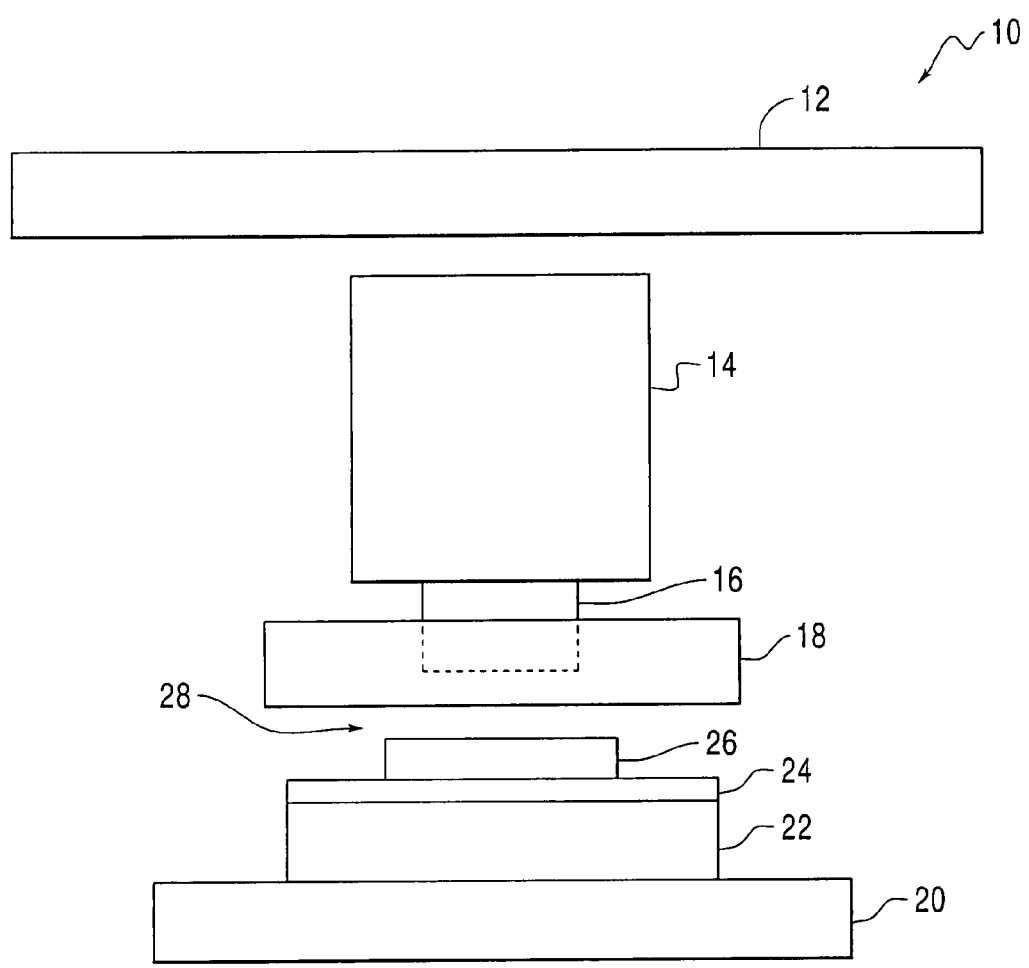
FIG. 1 is a diagram of an immersion lithography apparatus according to one embodiment of the present invention.

Referring to FIG. 1, a lithography apparatus is shown. The apparatus 10 includes an imaging element 12 which defines an image, a projection optical lens system 14 which includes a "last" or "final" optical element or lens 16, an immersion element 18, a coarse stage 20, a fine stage 22, and a substrate chuck 24 for holding a substrate 26. In FIG. 1, a gap 28 is provided between the top surface of the substrate 26 on one side and the optical element 16 and the immersion element 18 on the other side. The immersion element 18 is a gas curtain immersion element, which maintains an immersion fluid (not visible) in the gap 28. That is, a gas curtain is formed in the gap 28 between the immersion element 18 and the top surface of the substrate 26 to prevent the immersion fluid from escaping out of the gap 28. In various embodiments, the immersion element 18 forms a ring (as used herein, the term "ring" may be circular, rectangular square, oval or any other shape) fully or at least partially surrounding the exposure field of the projection optical lens system 14. For more information on gas curtain type immersion elements, see U.S. Patent Publications 2004/0207824, 2006/0087630, 2006/0158627, and 2006/0038968, U.S. Patent Publication 2005/0007569, European Patent Applications EP 1 477 856 A1 and EP 420 299 A2, each incorporated by reference herein in its entirety for all purposes.

Figure 2:
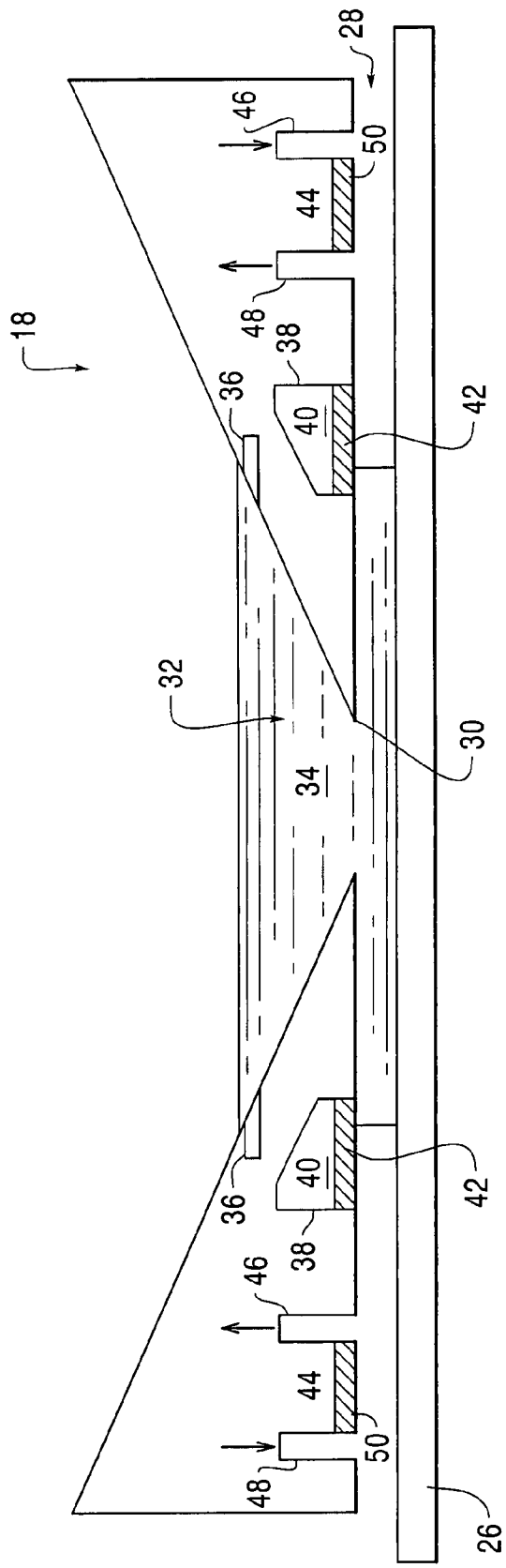
FIG. 2 is a diagram of an air curtain type immersion element used in one embodiment of the lithography apparatus of the present invention.

Referring to FIG. 2, a cross section diagram of the gas curtain immersion element 18 in accordance with one embodiment is shown. The element 18 surrounds the last optical element 16 of the projection optical lens system 14 (both 14 and 16 are not illustrated for the sake of clarity). The element 18 defines a fill-space 32 between the imaging surface of the substrate 26 and the last optical element 16. The fill-space 32 is filled so that the gap 28 between the last optical element 16 and the exposure area of the substrate 26 is immersed in the immersion fluid 34. The immersion fluid 34 is introduced into the fill-space 32 through fluid inlets 36. The immersion element 18 has an aperture 30 through which an image is projected onto the imaging surface of the substrate 26.

The immersion element 18 has a fluid removal element 38 which includes a chamber 40, which surrounds or substantially surrounds the fill-space 32. The fluid removal element 38 also includes a porous plate 42 formed along the bottom or lower surface of the chamber 40. A suitable vacuum control system (not illustrated) is fluidly connected to the chamber 40. In various embodiments, the porous plate 42 is made as thin as possible (i.e., from 10 to 100 microns thick) and has pores with a diameter ranging from 5 to 50 microns in one embodiment and from 5 to 200 microns in an alternative embodiment. In use, the chamber 40 is full of immersion fluid but is shown empty here for clarity.

During operation, the vacuum control system maintains the chamber 40 at a slight under-pressure so that air or other gasses are prevented from being drawn into the chamber 40. That is, the vacuum control system controls a pressure differential between an upper surface and a lower surface of the porous plate 42 so that substantially only immersion fluid passes through the porous plate 42. In FIG. 2, the imaging surface of the substrate 26 faces the lower surface of the porous plate 42. When immersion fluid contacts the lower surface of the plate 42, the fluid freely flows into the chamber 40 through the pores of the plate 42. For more information on the vacuum control system, see U.S. Patent Publications 2006/0152697, 2007/0222967 and 2006/0087630, each incorporated herein by reference in its entirety.

A gas seal 44 is also provided at the outer periphery of the immersion element 18. The gas seal 44 is provided radially outwardly from the fluid removal element 38 with respect to the aperture 30. The gas seal 44 includes a gas inlet 46 for providing a gas (e.g., air, synthetic air, $N_2$, or an inert gas) into the gap 28. The gas inlet 46 forms an annular groove, which is configured to surround or substantially surround the aperture 30, at the bottom surface of the immersion element 18. The seal 44 also includes a gas outlet 48, which is connected to a vacuum (not illustrated) or atmosphere, for extracting the gas from the gap 28. The gas outlet 48 forms an annular groove, which is configured to surround or substantially surround the aperture 30, at the bottom surface of the immersion element 18. The gas inlet 46 is provided radially outwardly from the gas outlet 48 with respect to the aperture 30. The over-pressure of the gas at the inlet 46 and the pressure level at the outlet 48 are controlled so that there is a relatively high velocity gas flow inward toward the fill-space 32, which tends to confine the immersion fluid. A porous material or porous member 50 is provided between the inlet 46 and outlet 48 on the bottom surface of the immersion element 18, facing the imaging surface of the substrate 26. The porous material 50 is configured to surround or substantially surround the aperture 30.

Figure 3:
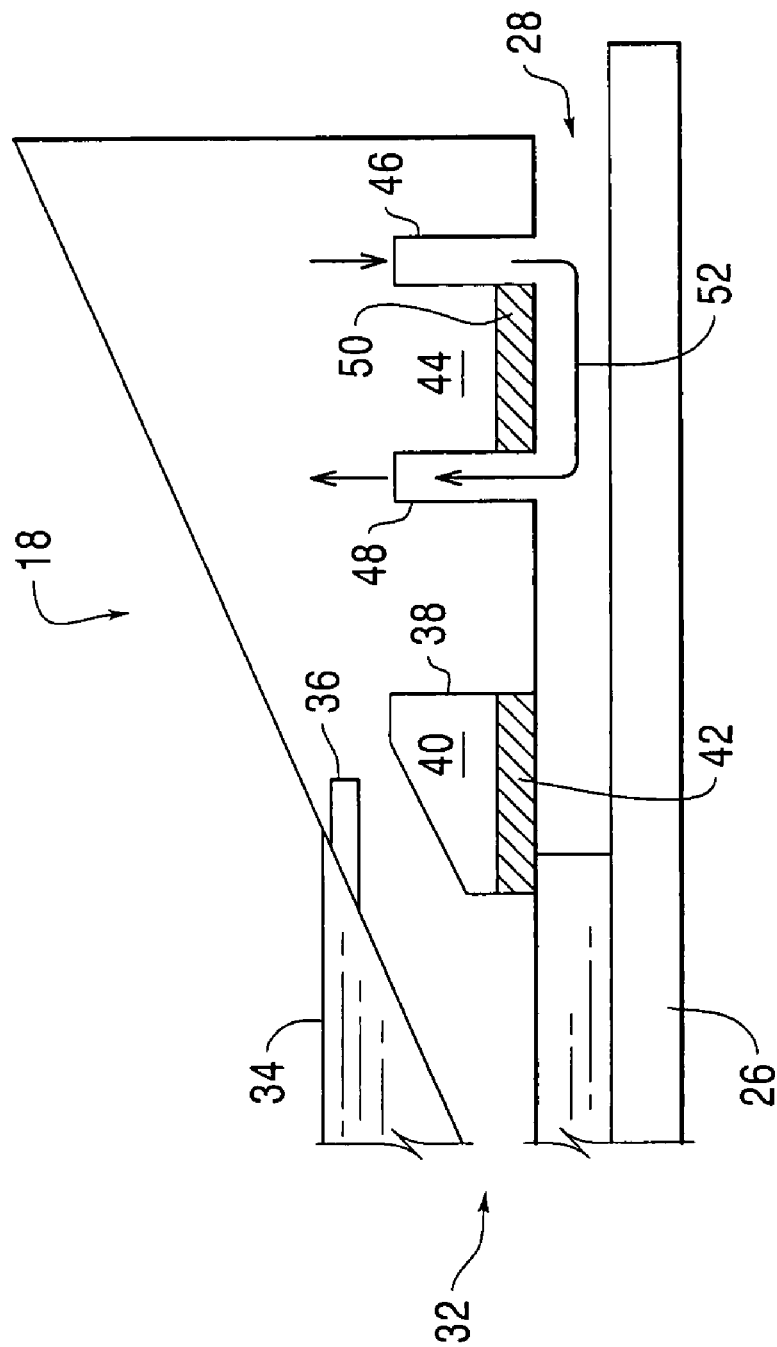
FIG. 3 is an enlarged diagram of the air curtain element of FIG. 2.

FIG. 3 is an enlarged diagram of the gas curtain of the immersion element 18 of FIG. 2. As illustrated in this Figure, the element 18 includes the fluid removal element 38 including the chamber 40 and porous plate 42. The gas seal 44 is also illustrated, including the gas inlet 46, the gas outlet 48, and the porous material 50. With this arrangement, the gas flows from the inlet 46 to the outlet 48, as designated by the arrow 52. As a result, a gas curtain is formed at the outer periphery of the element 18.

During operation, a majority of the fluid is removed via the fluid removal element 38. Fluid that is not removed by the element 38 is typically removed through the gas outlet 48. On occasion, however, fluid may not be removed through the outlet 48, causing fluid to collect on the bottom surface of the immersion element 18 between the gas inlet 46 and the outlet 48. This possibility is particularly true during movement of the substrate 26, for example during scanning, step and repeat, substrate exchanges, or alignment of the substrate. If fluid collects between the inlet 46 and outlet 48 of the gas seal 44, it may evaporate, causing cooling of the substrate. This is a significant problem because cooling of the substrate causes it to contract, resulting in alignment, overlay and/or printing errors.

To prevent the aforementioned problem, the gas seal 44 include the porous material 50. A vacuum (not illustrated) is applied to the porous material 50. In one embodiment, the pores of the material 50 are sufficiently small and the pressure differential across the material 50 created by the vacuum is controlled to allow the immersion fluid to pass through the material 50, while preventing gas from passing. If the fluid and gas were mixed during removal through the material 50, it is possible that evaporative cooling may occur, causing the immersion fluid to freeze inside and adjacent to the material 50.

In one embodiment, the porous material 50 has pores ranging from 0.1 to 50 microns and a thickness ranging from 100 to 10,000 microns. The pressure applied to the porous material may range from −3 kPa to −100 kPa. The porous material 50 removes any immersion fluid that may collect or otherwise bead up between the inlet 46 and outlet 48 of the gas seal 44, substantially reducing or eliminating the aforementioned problems associated with evaporative cooling. In one specific embodiment, the porous material 50 is a ceramic material such as made by Refractron Technologies, Newark, N.Y. In other embodiments, the porous material 50 may be metal, glass or any other suitable material.

Figure 4:
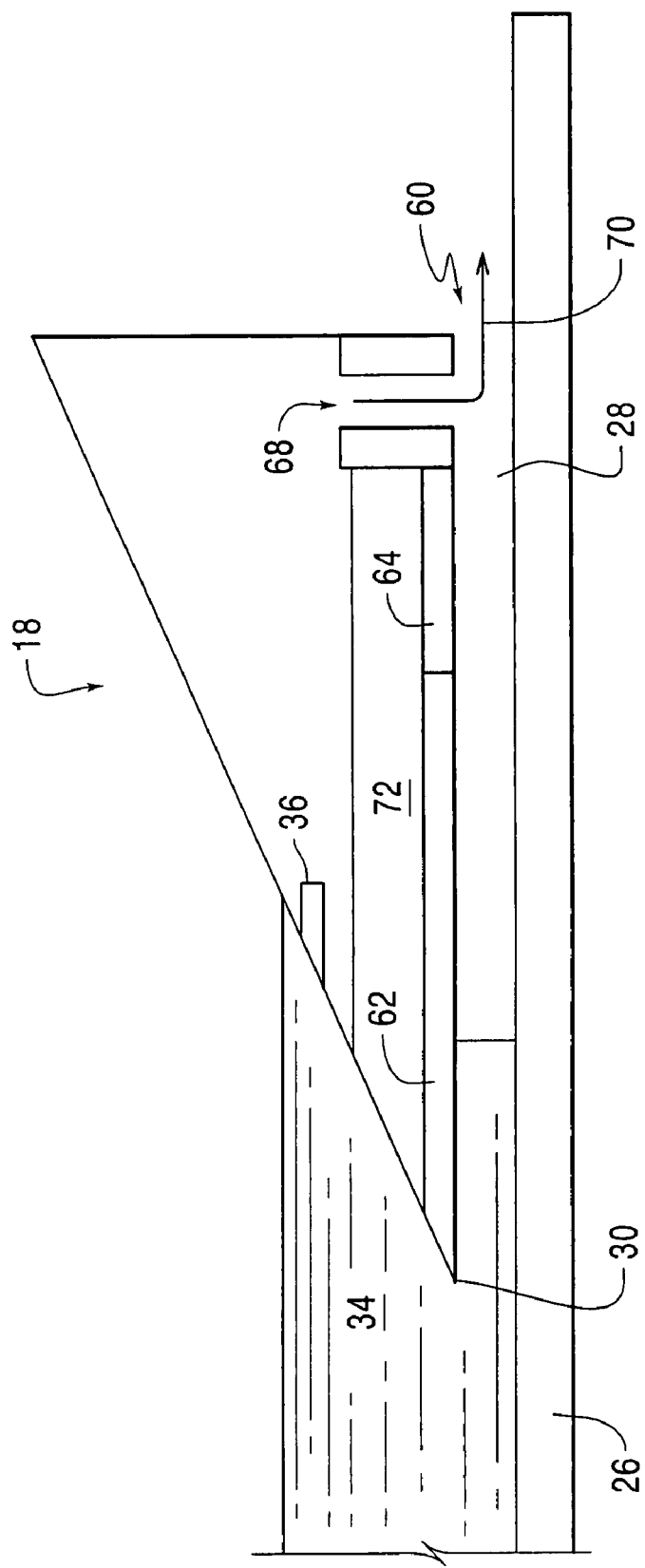
FIG. 4 is a diagram of an air curtain immersion element in accordance with another embodiment of the present invention.

FIG. 4 is a diagram of a gas curtain type immersion element 18 in accordance with another embodiment. In this embodiment, the element 18 includes an inner porous region 62, an outer porous region 64, and a gas seal 60 including a gas inlet 68. The inner 62 and outer 64 porous regions substantially cover the entire bottom surface of the element 18. The inner 62 and outer 64 porous regions are configured to surround or substantially surround the aperture 30, respectively. The outer region 64 is located radially outwardly from the inner region 62 with respect to the aperture 30. In one embodiment, the inner region 62 has a pore size ranging from 5 to 200 microns as is made as thin as possible, while the outer region 64 has a pore size ranging from 0.1 to 50 microns and a thickness ranging from 100 to 10,000 microns. In one embodiment, the thickness of the porous material in the outer porous region 64 is thinner than that of the inner porous region 62. With this arrangement, the inner porous region 62 is responsible for removing the majority of the fluid 34 in the gap 28 between the substrate 26 and the element 18.

A chamber 72 is provided adjacent the inner 62 and outer 64 porous regions in the immersion element 18. A suitable vacuum control system (not illustrated) is fluidly connected to the chamber 72. During operation, the vacuum control system maintains the chamber 72 at a slight under-pressure so that air or other gasses are prevented from being drawn into the chamber 72 through the inner 62 and outer 64 porous regions as described for the previous embodiment.

The gas seal 60 including the gas inlet 68 is located at the outer periphery of the element 18. The gas inlet 68 is located radially outwardly from the outer porous region 64 with respect to the aperture 30. The gas flow through the gas inlet 68, as designated by arrow 70, serves to restrict the flow of fluid out from the seal 60 by raising the pressure on the meniscus. With the pressure on the meniscus increased, the pressure against the outer porous region 64, which is located adjacent the gas inlet 68, is also increased. Consequently, the "bubble point" of the porous material of the outer region 64 should be made sufficiently higher than operational pressure, so that gas from the inlet 68 is not forced through the porous material. The bubble point is a feature of the porous material or porous member. The bubble point is determined by the size (diameter) of pores of the porous material and the like. The bubble point corresponds to the lowest pressure differential applied across the porous material at which gas begins to pass through the porous material. By making the bubble point of the porous material higher, the porous material can prevent gas from passing through the porous material, even if the pressure differential across the porous material increases. To ensure that the gas flow from the gas inlet 68 and the fluid through the porous region 64 are kept separate, the pores of the outer region 64 are made sufficiently small, thereby increasing the bubble point. If the bubble point is made too small, gas will pass through the porous material of the outer region 64, possibly resulting in evaporative cooling. As described above, in this embodiment, the range in diameter of the pores in the outer porous region 64 is smaller than that of the pores in the inner porous region 62. Therefore, the bubble point of the outer porous region 64 is higher than that of the inner porous region 62.

In one embodiment, the aforementioned porous ceramic from Refractron Technologies may be used. In yet other embodiments, materials such as metal, glass or other suitable materials may be used as well.

Figure 5A:
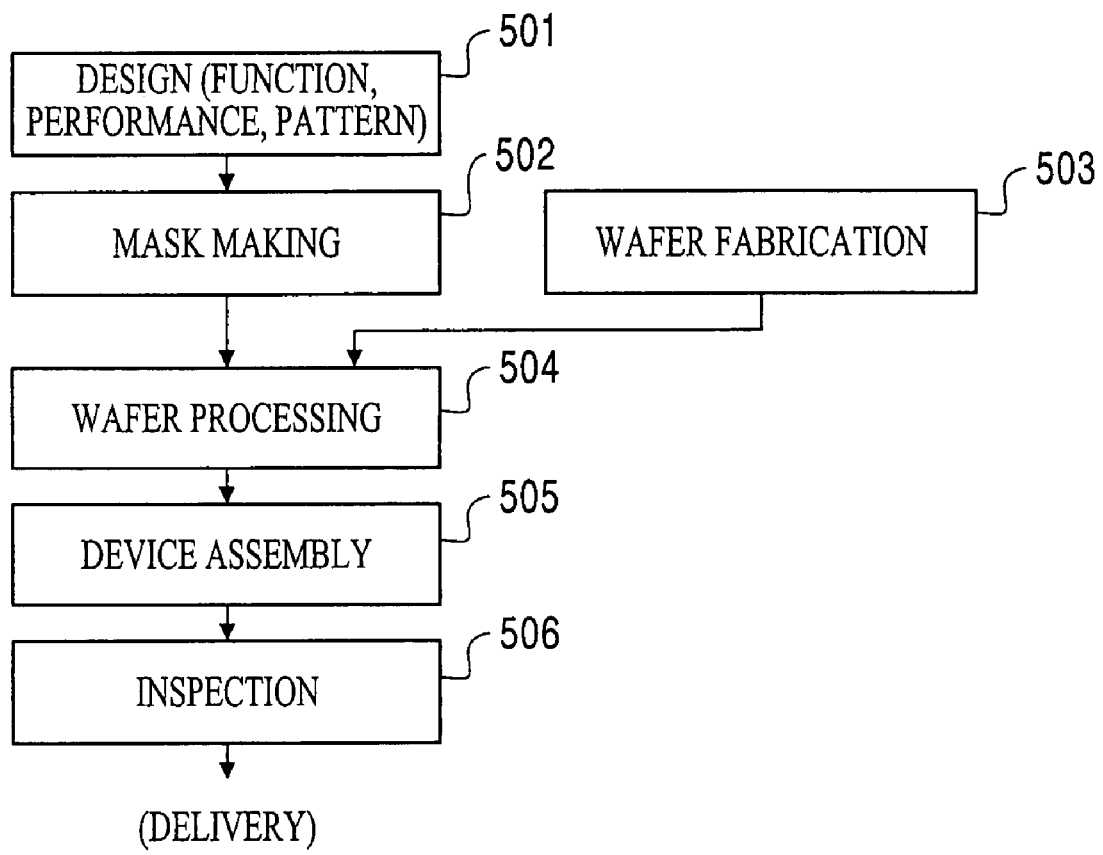
FIGS. 5A and 5B are flow charts illustrating the steps of fabricating semiconductor devices.

Semiconductor devices can be fabricated using the above described systems, by the process shown generally in FIG. 5A. In step 501 the device's function and performance characteristics are designed. Next, in step 502, a mask (reticle) having a pattern is designed according to the previous designing step, and in a parallel step 503 a wafer is made from a silicon material. The mask pattern designed in step 502 is exposed onto the wafer from step 503 in step 504 by a photolithography system described hereinabove in accordance with the present invention. In step 505 the semiconductor device is assembled (including the dicing process, bonding process and packaging process), finally, the device is then inspected in step 506.

Figure 5B:
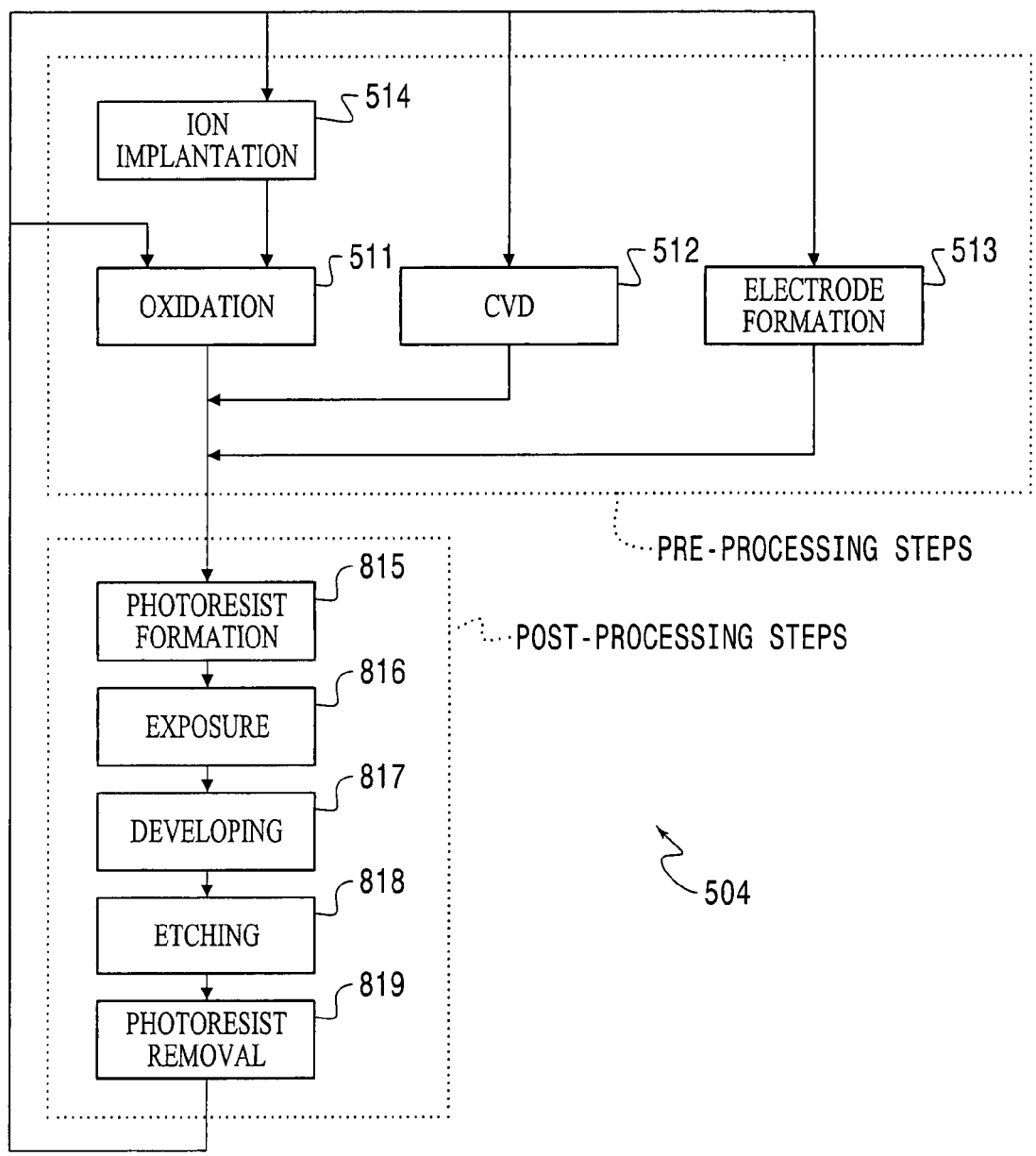

FIG. 5B illustrates a detailed flowchart example of the above-mentioned step 504 in the case of fabricating semiconductor devices. In FIG. 5B, in step 511 (oxidation step), the wafer surface is oxidized. In step 512 (CVD step), an insulation film is formed on the wafer surface. In step 513 (electrode formation step), electrodes are formed on the wafer by vapor deposition. In step 514 (ion implantation step), ions are implanted in the wafer. The above-mentioned steps 511-514 form the preprocessing steps for wafers during wafer processing, and selection is made at each step according to processing requirements.

It should be noted that the particular embodiments described herein are merely illustrative and should not be construed as limiting. For example, the substrate described herein does not necessarily have to be a semiconductor wafer. It could also be a flat panel used for making flat panel displays. Rather, the true scope of the invention is determined by the scope of the accompanying claims.

What is claimed is:

1. An apparatus, comprising:
   a substrate holder which holds a substrate having an imaging surface;
   a projection optical system having a last optical element, during an exposure operation the projection optical system projecting an image onto a target imaging area on the imaging surface of the substrate through an immersion liquid filled in a space between the imaging surface of the substrate and the last optical element;
   an immersion element which maintains the immersion liquid in the space between the imaging surface of the substrate and the last optical element during the exposure operation, the immersion element having a gas inlet for providing gas, the gas being provided from the gas inlet into a gap between the immersion element and an object facing the immersion element;
   a liquid outlet in the immersion element, the immersion liquid being removed from the gap through the liquid outlet; and
   a first porous region provided adjacent the gas inlet of the immersion element, the first porous region allowing the immersion liquid to pass therethrough from the gap while substantially preventing gas from passing therethrough from the gap, the first porous region being located radially outwardly of the liquid outlet relative to the space, the gas inlet being located radially outwardly of the first porous region relative to the space.

2. The apparatus of claim 1, wherein the first porous region is fluidly coupled to a vacuum, the vacuum creating a pressure differential across the first porous region so that the immersion liquid passes through the first porous region while substantially preventing gas from passing through the first porous region.

3. The apparatus of claim 1, wherein the first porous region has pores ranging in diameter from 0.1 to 50 microns.

4. The apparatus of claim 1, wherein the first porous region consists of one of the following materials: a porous ceramic, metal or glass.

5. The apparatus of claim 1, wherein the immersion element further comprises a gas outlet which removes gas in the gap.

6. The apparatus of claim 5, wherein the gas inlet is positioned adjacent the gas outlet of the immersion element.

7. The apparatus of claim 6, wherein the first porous region is positioned between the gas inlet and the gas outlet on the immersion element.

8. The apparatus of claim 1, further comprising a second porous region provided on the immersion element, the second porous region being provided for the liquid outlet to remove the immersion liquid from the gap.

9. The apparatus of claim 8, wherein the second porous region is fluidly connected to a vacuum, the vacuum creating a pressure differential across the second porous region so that the immersion liquid passes through the second porous region while substantially preventing gas from passing through the second porous region.

10. The apparatus of claim 8, wherein the second porous region has pores ranging in diameter from 5 to 50 microns.

11. The apparatus of claim 8, wherein a size of pores of the second porous region is smaller than a size of pores of the first porous region.

12. The apparatus of claim 11, further comprising a chamber positioned adjacent the first and second porous regions, the chamber being fluidly connected to a vacuum so that the immersion liquid is allowed to pass through the first and second porous regions from the gap while gas is substantially prevented from passing through the first and second porous regions.

13. The apparatus of claim 1, wherein the immersion element forms a fill-space to be filled with the immersion liquid, the fill-space being positioned under the last optical element of the projection optical system and above the target imaging area of the imaging surface of the substrate during the projection.

14. The apparatus of claim 1, wherein the immersion element includes an aperture through which the image is projected to the target imaging area during the projection.

15. The apparatus of claim 14, wherein the liquid outlet is positioned between the aperture and the first porous region.

16. The apparatus of claim 1, wherein the gas inlet and the first porous region are provided at an outer periphery of the immersion element.

17. The apparatus of claim 14, wherein the gas inlet and the first porous region of the immersion element surround or substantially surround the aperture.

18. The apparatus of claim 14, wherein the liquid outlet surrounds or substantially surrounds the aperture.

19. The apparatus of claim 1, wherein the immersion element forms a ring at least partially around the projection optical system.

20. The apparatus of claim 1, wherein the gas consists of one of the following: air, synthetic air, $N_2$, or an inert gas.

21. The apparatus of claim 8, wherein a porous member of the second porous region is thinner than a porous member of the first porous region.

22. The apparatus of claim 1, wherein a porous member of the first porous region has a thickness ranging from 100 to 10,000 microns.

23. The apparatus of claim 8, wherein a porous member of the second porous region has a thickness that is thinner than a thickness of the first porous region.

24. The apparatus of claim 8, wherein the second porous region has pores ranging from 50 to 200 microns.

25. The apparatus of claim 8, wherein a range in size of pores of the second porous region is smaller than a range in size of pores of the first porous region.

26. The apparatus of claim 1, wherein the object includes the substrate to be exposed.

27. A device manufacturing method comprising:
exposing a substrate via the projection optical system of the apparatus of claim 1; and
developing the exposed substrate.

28. A lithography exposure method comprising:
filing a space between a projection optical system and a substrate with an immersion liquid using an immersion element;
exposing the substrate through the immersion liquid in the space between the projection optical system and the substrate;
providing gas into a gap between the immersion element and the substrate from a gas inlet of the immersion element;
removing the immersion liquid from the gap through a liquid outlet of the immersion element;
creating a pressure differential across a first porous region of the immersion element so that the immersion liquid passes through the first porous region from the gap while substantially preventing gas from passing through the first porous region from the gap;
wherein the first porous region is located radially outwardly of the liquid outlet relative to the space, and the gas inlet is located radially outwardly of the first porous region relative to the space.

29. The method of claim 28, further comprising removing gas in the gap through a gas outlet of the immersion element.

30. The method of claim 29, wherein the first porous region is positioned between the gas inlet and the gas outlet.

31. The method of claim 28, wherein the liquid outlet includes a second porous region through which the immersion liquid is removed from the gap.

32. The method of claim 31, further comprising creating a pressure differential across the second porous region so that the immersion liquid passes through the second porous region while substantially preventing gas from passing through the second porous region.

33. The method of claim 28, wherein the immersion element includes an aperture through which an image is projected to a target imaging area of the substrate during the projection.

34. The method of claim 33, wherein the liquid outlet is positioned between the aperture and the first porous region.

35. The method of claim 33, wherein the gas inlet and the first porous region of the immersion element surrounds or substantially surrounds the aperture.

36. The method of claim 33, wherein the liquid outlet surrounds or substantially surrounds the aperture.

37. The method of claim 28, wherein the gas includes one of the following: air, synthetic air, $N_2$, or an inert gas.

* * * * *

UNITED STATES PATENT AND TRADEMARK OFFICE
CERTIFICATE OF CORRECTION

PATENT NO. : 7,576,833 B2  Page 1 of 1
APPLICATION NO. : 11/987788
DATED : August 18, 2009
INVENTOR(S) : Alex Ka Tim Poon et al.

It is certified that error appears in the above-identified patent and that said Letters Patent is hereby corrected as shown below:

In claim 28, col. 8, line 16:
Change "filing" to --filling--.

Signed and Sealed this

Twenty-seventh Day of October, 2009

David J. Kappos
*Director of the United States Patent and Trademark Office*